United States Patent
Yang et al.

(10) Patent No.: US 11,612,936 B2
(45) Date of Patent: Mar. 28, 2023

(54) METHOD FOR PREPARING OXYGEN-FREE PASSIVATED TITANIUM OR TITANIUM-ALLOY POWDER PRODUCT BY MEANS OF GAS-SOLID FLUIDIZATION

(71) Applicant: University of Science and Technology Beijing, Beijing (CN)

(72) Inventors: Fang Yang, Beijing (CN); Yanru Shao, Beijing (CN); Yang Zhou, Beijing (CN); Zhimeng Guo, Beijing (CN); Yanli Sui, Beijing (CN); Qian Qin, Beijing (CN); Cunguang Chen, Beijing (CN)

(73) Assignee: University of Science and Technology Beijing, Beijing (CN)

( * ) Notice: Subject to any disclaimer, the term of this patent is extended or adjusted under 35 U.S.C. 154(b) by 10 days.

(21) Appl. No.: 17/275,198

(22) PCT Filed: Mar. 27, 2020

(86) PCT No.: PCT/CN2020/081737
§ 371 (c)(1),
(2) Date: Mar. 11, 2021

(87) PCT Pub. No.: WO2021/168978
PCT Pub. Date: Sep. 2, 2021

(65) Prior Publication Data
US 2021/0308765 A1 Oct. 7, 2021

(30) Foreign Application Priority Data

Feb. 24, 2020 (CN) .......................... 202010114056.5

(51) Int. Cl.
| | |
|---|---|
| B22F 9/30 | (2006.01) |
| B22F 3/16 | (2006.01) |
| C23C 16/08 | (2006.01) |
| C23C 16/442 | (2006.01) |
| C23C 16/448 | (2006.01) |
| B22F 1/16 | (2022.01) |
| B22F 1/145 | (2022.01) |
| B33Y 10/00 | (2015.01) |
| B33Y 70/00 | (2020.01) |

(52) U.S. Cl.
CPC ................ *B22F 9/30* (2013.01); *B22F 1/145* (2022.01); *B22F 1/16* (2022.01); *B22F 3/16* (2013.01); *C23C 16/08* (2013.01); *C23C 16/442* (2013.01); *C23C 16/4481* (2013.01); *B22F 2202/15* (2013.01); *B22F 2301/205* (2013.01); *B22F 2998/10* (2013.01); *B33Y 10/00* (2014.12); *B33Y 70/00* (2014.12)

(58) Field of Classification Search
CPC .......... B22F 1/0088; B22F 1/025; B22F 3/16; C23C 16/442; C23C 16/08; C22C 14/00
See application file for complete search history.

(56) References Cited

U.S. PATENT DOCUMENTS

| | | | | |
|---|---|---|---|---|
| 4,127,503 A | * | 11/1978 | Yoshikawa | A23L 3/3436 |
| | | | | 252/188.28 |
| 4,892,759 A | * | 1/1990 | Arai | C23C 16/4488 |
| | | | | 427/249.17 |
| 5,227,195 A | * | 7/1993 | Sanjurjo | B22F 9/30 |
| | | | | 427/248.1 |
| 5,855,678 A | * | 1/1999 | Sanjurjo | C23C 16/448 |
| | | | | 118/715 |
| 7,435,282 B2 | | 10/2008 | Armstrong et al. | |
| 2009/0120239 A1 | * | 5/2009 | Jensen | C22B 5/14 |
| | | | | 75/392 |
| 2010/0068379 A1 | * | 3/2010 | Rollick | C23C 14/24 |
| | | | | 427/216 |
| 2015/0328684 A1 | * | 11/2015 | Moxson | B22F 3/17 |
| | | | | 419/28 |
| 2018/0221946 A1 | * | 8/2018 | Mazet | C23G 5/00 |
| 2019/0201974 A1 | * | 7/2019 | Haidar | C23C 20/04 |

FOREIGN PATENT DOCUMENTS

| | | | |
|---|---|---|---|
| CN | 1852997 A | 10/2006 | |
| CN | 101035923 A | 9/2007 | |
| CN | 101111616 A | 1/2008 | |
| CN | 101568398 A | 10/2009 | |
| CN | 102888493 A | 1/2013 | |
| CN | 107570723 A | 1/2018 | |
| CN | 108465806 A | 8/2018 | |
| CN | 109360889 A | 2/2019 | |
| CN | 109848405 A | 6/2019 | |
| CN | 111101019 A | 5/2020 | |
| DE | 102004028922 A1 | 2/2005 | |
| JP | 2004356612 A | 12/2004 | |
| RU | 1802752 C * | 3/1993 | ................ B22F 7/04 |

OTHER PUBLICATIONS

Cameo Chemicals; "Vanadium Tetrachloride Datasheet"; Retrieved from internet Mar. 1, 2022; https://cameochemicals.noaa.gov/chemical/1688 (Year: 2022).*

* cited by examiner

*Primary Examiner* — Kevin E Yoon
*Assistant Examiner* — Austin Pollock
(74) *Attorney, Agent, or Firm* — Bayramoglu Law Offices LLC

(57) ABSTRACT

A method for preparing an oxygen-free passivated titanium or titanium-alloy powder product by means of gas-solid fluidization is provided. The new method includes placing the metal halide and the titanium powder which meet formula requirements into a gasifier and a fluidized bed reactor respectively; heating the gasifier to gasify the metal halide, and introducing dry argon and halide gas into the fluidized bed reactor; opening the fluidized bed, heating the fluidized bed, fluidizing the titanium powder after the introduction of the argon and the metal halide gas, and cooling the product to obtain the titanium powder subjected to oxygen-free passivation using metal chloride; molding the oxygen-free passivated titanium powder into a green body with powder metallurgy technology; and sintering the green body in vacuum or argon atmosphere according to the molding technology, and after temperature rise treatment, performing a densification sintering operation to obtain a high-performance titanium product component.

5 Claims, No Drawings

METHOD FOR PREPARING OXYGEN-FREE PASSIVATED TITANIUM OR TITANIUM-ALLOY POWDER PRODUCT BY MEANS OF GAS-SOLID FLUIDIZATION

CROSS REFERENCE TO THE RELATED APPLICATION

This application is the national phase entry of International Application No. PCT/CN2020/081737, filed on Mar. 27, 2020, which is based upon and claims priority to Chinese Patent Application No. 202010114056.5, filed on Feb. 24, 2020, the entire contents of which are incorporated herein by reference.

TECHNICAL FIELD

The present invention pertains to the field of powder metallurgy titanium, and provides a method for realizing oxygen-free passivation of titanium or titanium-alloy powder by means of gas-solid fluidization.

BACKGROUND

Powder metallurgy titanium and titanium alloy have uniform structures, fine grains and a near net shape forming characteristic, thus attracting wide attention of titanium workers in the world. However, due to a large specific surface area, powder, particularly titanium or titanium alloy powder having a finer grain size is extremely sensitive to interstitial elements, such as oxygen, nitrogen, hydrogen, or the like, and impurity elements, such as oxygen, nitrogen, or the like, are easily adsorbed on the surface of the titanium powder, which increases the impurity content of the titanium powder. On the one hand, the content of interstitial atomic oxygen (O) is one of key factors influencing the mechanical property of titanium, and hydrogenation dehydrogenation powder with lower price is fine, has an irregular shape, and has an oxygen content increased in shape forming and processing processes, such that the property is unable to meet use requirements, thus limiting usage of the low-cost titanium powder; and on the other hand, the titanium powder with a low oxygen content has higher requirements for control over the oxygen content in transportation and storage processes, resulting in higher product packaging, storage and transportation cost. Therefore, currently, the low-cost powder metallurgy titanium and titanium alloy have important research directions of performing passivation protection on the titanium powder to control formation of an oxidation film caused by adsorption of oxygen atoms on the surface of the titanium, improving the application environment and process of irregular fine powder, reducing the storage and transportation cost of the titanium powder, and preparing a titanium product with an excellent overall performance.

Currently, there exists less research on surface passivation treatment of the titanium powder, and patents CN201810200270.5, CN201910133682.6, or the like, propose that the oxygenation problem of the powder in the later use and transportation processes is controlled by the degree to which the titanium powder is coated with organic matter. However, the coating operation using the liquid organic matter is difficult to control, a solution concentration which is excessively high may cause an excessive coating amount on the surface of the powder, the coating matter is difficult to remove in the later sintering process, and a solution concentration which is excessively low is unable to achieve the coating effect. In addition, patent CN202010006974.6 proposes that the surfaces of particles of the titanium powder are purified by metal chloride with a liquid phase method, but this patent realizes powder passivation by physically coating the surface of the titanium powder with metal halide, and a coating solution is prepared by an organic solvent during liquid phase passivation. In order to realize chemical passivation of the titanium powder without usage of the organic solvent, the present invention provides a method for realizing oxygen-free passivation of titanium or titanium alloy powder by means of gas-solid fluidization, including: vaporizing low-boiling-point metal halide ($MX_a$, M representing metal elements, and X representing halogen elements, such as F, Cl, Br and I) by a fluidized bed; performing oxygen-free passivation on the titanium powder by gaseous metal chloride at a certain temperature; and forming a Ti-M-X oxygen-free passivation layer or a Ti-M metal passivation layer on the surface of the titanium powder by controlling gas-solid fluidization temperature, so as to finally realize the oxygen-free passivation of the titanium powder by Ti-M-X or Ti-M. Meanwhile, the oxygen-free passivation layer may be uniformly deposited on the surface of the titanium powder by means of gas-solid fluidization, thus preventing nonuniform passivation caused by agglomeration and adhesion of the powder.

SUMMARY

An object of the present invention is to provide a method for realizing oxygen-free passivation of titanium or titanium alloy powder by means of gas-solid fluidization; and in the method, metal halide is vaporized by a fluidized bed; and the titanium powder reacts with the metal halide at a certain temperature to form a Ti-M-X or Ti-M oxygen-free passivation layer on the surface of the titanium powder, thereby effectively realizing low-gap control over the titanium powder; and meanwhile, generation of gaseous $TiX_xO_y$ is beneficial to breaking an oxidation film on the surface of the titanium powder, purifying the surfaces of particles of the titanium powder and promoting sintering densification, and the metal element M is beneficial to realizing further sintering densification or microalloying of a titanium product, thereby improving the overall performance of the titanium product.

The titanium or titanium alloy powder and the metal halide have a mass ratio of 80:20-98:2, and the above-mentioned method for preparing the oxygen-free passivated titanium or titanium-alloy powder product by means of gas-solid fluidization includes the following steps:

(1) placing the metal halide and the titanium powder which meet formula requirements into a gasifier and a fluidized bed reactor respectively;

(2) heating the gasifier to a certain temperature to gasify the metal halide, and introducing dry argon and halide gas into the fluidized bed reactor in a volume ratio of 10:90-90:10 at a certain flow rate;

(3) opening the fluidized bed, heating the fluidized bed to a certain temperature, fluidizing the titanium powder for 10-300 min after the introduction of the argon and the metal halide gas, and cooling the product to obtain the titanium powder subjected to oxygen-free passivation using metal chloride;

(4) molding the oxygen-free passivated titanium powder obtained in step (3) into a green body with powder metallurgy technology; and (5) sintering the green body obtained in step (4) in vacuum or argon atmosphere according to the molding technology, and after temperature rise treatment, performing a densification sintering operation with a sintering temperature of 1070-1400° C. and a heat preservation time of 0.5-5 h, so as to finally obtain a high-performance titanium product component.

Further, the metal halide in step (1) is one of anhydrous $SnF_4$, $SnCl_4$, $SnBr_4$, $SnI_4$, $FeCl_3$ and $VCl_4$.

Further, the titanium powder in step (1) includes various kinds of pure titanium powder or titanium alloy powder which are commercially available.

Further, the heating temperature of the gasifier in step (2) is 50-400° C., and the gas flow rate is 100-300 ml/min.

Further, the heating temperature of the fluidized bed in step (3) is 100-500° C.

Further, the powder metallurgy technology in step (4) includes die forming, isostatic pressing, 3D printing, injection forming, gel casting forming, 3D cold printing or binder jetting technologies.

Further, the temperature rise treatment in step (5) includes: raising the temperature from room temperature to 100-650° C. at a temperature raising rate of 0.5-3° C./min, and keeping the temperature for 120-240 min.

The present invention has the following advantages.

(1) Chemical passivation is performed on the titanium or titanium alloy powder with a gas-solid fluidization process, a liquid medium is not required, and an organic solvent is not used, such that the titanium-powder passivation process is simpler and easy to control, and secondary powder pollution caused by the organic solvent medium is avoided.

(2) The low-boiling-point metal halide is vaporized by the fluidized bed to form the oxygen-free passivation layer on the surface of the titanium powder, the formed Ti-M-X oxygen-free passivation layer or Ti-M metal passivation layer has no negative influence on the properties of the titanium powder, and a plurality of processes may be adopted for the subsequent forming operation.

(3) The Ti-M-X or Ti-M oxygen-free passivation layer on the surface of the titanium powder may be controlled by adjusting the fluidization temperature, and the appropriate oxygen-free passivation layer may be selected according to actual production requirements.

(4) The generated oxygen-free passivation layer may effectively inhibit and control adsorption of oxygen atoms on the surface of the titanium powder, improve the application environment and process of irregular fine powder, reduce the storage and transportation cost of the titanium powder and prepare the titanium product with an excellent overall performance.

(5) The oxygen-free passivation layer formed on the surface of the titanium or titanium alloy powder may be more uniform and compact with the fluidization process, and the oxygen-free passivation effect on the titanium powder is not influenced by the agglomeration effect of the particle size, the shape, or the like, of the powder.

(6) The method has high applicability, has no limit on the particle size distribution, shape and type of the titanium powder, has wide application and a simple process, and realizes large-batch continuous operation.

DETAILED DESCRIPTION OF THE EMBODIMENTS

First Embodiment

30-μm hydrogenation dehydrogenization (HDH) pure titanium powder and $VCl_4$ have a mass ratio of 80:20, and a method includes:

(1) placing the $VCl_4$ and the HDH pure titanium powder which meet formula requirements into a gasifier and a fluidized bed reactor respectively;

(2) heating the gasifier to 180° C. to gasify the $VCl_4$, and introducing the $VCl_4$ and dry argon into the fluidized bed reactor in a volume ratio of 20:80;

(3) opening a fluidized bed, heating the fluidized bed to 300° C., fluidizing the titanium powder for 80 min after the introduction of the argon and the metal halide gas, and cooling the product to obtain the titanium powder subjected to oxygen-free passivation;

(4) forming the oxygen-free passivated titanium powder obtained in step (3) into a green body using a polyoxymethylene binder system with an injection forming process; and (5) performing acid removal on the green body obtained in step (4) at 120° C., then heating the green body to 450° C. at a speed of 2° C./min, keeping the temperature for 120 min, then heating the green body to 1270° C., and keeping the temperature for 2.5 h, so as to obtain an injection-formed high-performance titanium component, wherein the whole process is performed in a vacuum debinding sintering furnace.

Second Embodiment

20-μm gas-atomized titanium alloy powder Ti-40Al and $SnCl_4$ have a mass ratio of 92:8, and the performed whole operation and a device are located in argon protection atmosphere. A method includes:

(1) placing the $SnCl_4$ and the titanium powder Ti-40Al which meet formula requirements into a gasifier and a fluidized bed reactor respectively;

(2) heating the gasifier to 120° C. to gasify the $SnCl_4$, and introducing the $SnCl_4$ and dry argon into the fluidized bed reactor in a volume ratio of 15:85;

(3) opening a fluidized bed, heating the fluidized bed to 150° C., fluidizing the titanium powder for 50 min after the introduction of the argon and the metal halide gas, and cooling the product to obtain the titanium powder Ti-40Al subjected to oxygen-free passivation;

(4) pressing the oxygen-free passivated titanium powder obtained in step (3) using an isostatic cool pressing technology; and (5) placing a green body obtained in step (4) into a vacuum furnace with a vacuum degree of 3-10 MPa, heating the green body to 350° C. at a speed of 2.5° C./min, keeping the temperature for 180 min, then heating the green body to 1400° C., and keeping the temperature for 2 h, so as to obtain a high-performance titanium-aluminum alloy component.

Third Embodiment

−500-mesh ion-spheroidized powder TC4 and $SnCl_4$ have a mass ratio of 95:5, and the performed whole operation and a device are located in argon protection atmosphere. A method includes:

(1) placing metal halide and the powder TC4 which meet formula requirements into a gasifier and a fluidized bed reactor respectively;

(2) heating the gasifier to 150° C. to gasify the $SnCl_4$, and introducing the $SnCl_4$ and dry argon into the fluidized bed reactor in a volume ratio of 10:90;

(3) opening a fluidized bed, heating the fluidized bed to 500° C., fluidizing the titanium powder for 30 min after the introduction of the argon and the metal halide gas, and cooling the product to obtain the titanium powder subjected to oxygen-free passivation;

(4) performing a gel casting forming operation on the oxygen-free passivated titanium powder obtained in step (3) by a low-molecular-weight gel system; and (5) in argon, heating a green body obtained in step (4) to 450° C. at a speed of 2° C./min, keeping the temperature for 140 min, then heating the green body to 1230° C., and keeping the temperature for 3 h, so as to obtain a high-performance TC4 titanium component.

What is claimed is:

1. A method for preparing an oxygen-free passivated titanium or titanium-alloy powder product by means of gas-solid fluidization, comprising:
   1) placing a metal halide and a titanium powder into a gasifier and a fluidized bed reactor respectively, wherein the titanium powder and the metal halide have a mass ratio of 80:20-98:2;
   2) heating the gasifier to a first predetermined temperature to gasify the metal halide to obtain a metal halide gas, and introducing dry argon and the metal halide gas into the fluidized bed reactor in a volume ratio of 10:90-90:10 at a predetermined flow rate;
   3) initiating the fluidized bed reactor, heating the fluidized bed reactor to a second predetermined temperature, fluidizing the titanium powder for 10-300 min after introducing the dry argon and the metal halide gas to obtain a product, and cooling the product to obtain a metal halide oxygen-free passivated titanium powder, wherein the second predetermined temperature is greater than the first predetermined temperature, and the titanium powder is fluidized by the fluidized bed reactor;
   4) molding the metal halide oxygen-free passivated titanium powder obtained in step 3 into a green body with a powder metallurgy technology; and
   5) sintering the green body obtained in step 4 in vacuum or an argon atmosphere according to a molding technology, and after a temperature rise treatment on the green body, performing a densification sintering operation on the green body with a sintering temperature of 1070-1400° C. and a heat preservation time of 0.5-5 h to finally obtain a titanium product component,
   wherein the metal halide in step 1 is one selected from the group consisting of anhydrous $SnF_4$, anhydrous $SnBr_4$, and anhydrous $SnI_4$; and
   no liquid medium or organic solvent is used while performing steps 1 to 3.

2. The method according to claim 1, wherein the first predetermined temperature of the gasifier in step 2 is 50-400° C., and the predetermined flow rate is 100-300 ml/min.

3. The method according to claim 1, wherein the second predetermined temperature of the fluidized bed reactor in step 3 is 100-500° C.

4. The method according to claim 1, wherein the powder metallurgy technology in step 4 comprises a die forming technology, an isostatic pressing technology, a 3D printing technology, an injection forming technology, or a gel casting forming technology.

5. The method according to claim 1, wherein the temperature rise treatment in step 5 comprises: raising to a third predetermined temperature from room temperature to 100-650° C. at a temperature raising rate of 0.5-3° C./min, and keeping the third temperature for 120-240 min.

* * * * *